United States Patent [19]

Kwan

[11] 4,319,196

[45] Mar. 9, 1982

[54] TEMPERATURE COMPENSATED WIDE DYNAMIC RANGE LINEAR ENVELOPE DETECTOR

[75] Inventor: Shue-Yu Kwan, Odenton, Md.

[73] Assignee: Westinghouse Electric Corp., Pittsburgh, Pa.

[21] Appl. No.: 130,875

[22] Filed: Mar. 17, 1980

[51] Int. Cl.³ .............................................. H03D 1/10
[52] U.S. Cl. .................................. 329/204; 329/206; 455/337
[58] Field of Search ........... 329/101, 203, 204, 205 R, 329/206, 166; 455/337

[56] References Cited

U.S. PATENT DOCUMENTS 3,921,086 11/1975 Marek .................................. 329/204
4,000,472 12/1976 Eastland et al. ..................... 329/204

OTHER PUBLICATIONS

Eguizabal, "Biasing the diode improves a-m detector performance", Electronics, Aug. 4, 1977, p. 97.

Primary Examiner—Siegfried H. Grimm
Attorney, Agent, or Firm—H. W. Patterson

[57] ABSTRACT

An amplitude modulation detection apparatus that includes an envelope detector portion having a pair of diode rectifiers electrically connected at their cathodes which common cathode connection is connected through a series resistor to the input of a low-pass video filter having parallel-connected termination resistors at its output and input of a selected value. A forward biasing circuit that includes a DC voltage source coupled to a low input off-set operational amplifier having its output applied to the pair of diode rectifiers. A third diode rectifier is connected to the input of the operational amplifier at one side and to ground through a series-connected resistor. The series-connected resistor has a value that is determined in accordance with the values of the resistor connected to the commonly connected cathodes and the termination resistors in order to subject the three diode rectifiers to identical operating conditions to obtain optimum temperature compensation.

6 Claims, 3 Drawing Figures

TEMPERATURE COMPENSATED WIDE DYNAMIC RANGE LINEAR ENVELOPE DETECTOR

GOVERNMENT CONTRACT

The Government has rights in this invention under Contract No. F-19628-70-C-0218 awarded by the Department of the Air Force.

BACKGROUND OF THE INVENTION

The present invention relates to a modulation detection apparatus; and more particularly, to a temperature compensated wide dynamic range linear envelope detector.

Amplitude modulation envelope detectors are used in electronic systems to obtain video bandwidth information frequencies as a linear function of the modulated carrier signal. Since the modulation bandwidth may be in the order of megahertz, and in order to obtain the modulation frequencies at the output of the detector in a linear manner, the impedance which is acting as a load, is generally kept low to provide a wide video bandwidth. However, for small load impedances, low amplitude input signals to the detector become affected by the non-linear region of the operating characteristics of the detector components. Increasing the envelope detector drive level to remain above the component non-linear operating region creates the disadvantages of requiring high drive power requirements for the detector. Therefore, forward biasing of the detector components has been employed to improve the linearity of component operating characteristics at low input levels. Moreover, the temperature drift component characteristics of the forward biased detectors resulted in an unstable offset voltage causing the loss of low level input signals.

Also, and referring to FIG. 1, it has been proposed, heretofore, to provide an amplitude modulation detector 10 having a pair of balanced diode rectifiers 11 and 12 to detect amplitude modulation at rates up to the carrier frequency. In such a detector, a forward biasing circuit within dashed lines referred to at 13 provides a trickle of current to the balanced diodes to improve rectification at very low levels and increases the detector linearity over a wide input signal range. The biasing circuit 13 utilizes diodes 14 and 15 that are matched with diodes 12 and 11 respectively and a pair of low DC off-set (below said level) operational amplifiers 16 and 17 that are used as voltage followers and exhibit a stiff bias voltage, which voltage changes with temperature in order to stabilize the current in the balanced diode rectifiers 11 and 12. The forward biasing supply $V_1$ and $V_2$ of the biasing circuit 13 produces an essentially constant trickle current in each of the pair of diodes 11 and 12 as a function of ambient temperature variation. A transformer 20 having a primary winding 21 and secondary windings 22 and 23 couples IF amplifiers 24 and 25 to the detector diodes 11 and 12 via the primary and secondary windings. The operational amplifiers 16 and 17 are connected at their outputs to respective ones of the secondary windings 22 and 23 over lines 26 and 27. The biasing voltage $V_1$ is applied to operational amplifier 17 and a similar biasing voltage is applied to the operational amplifier 16 for providing the forward biasing potential.

The signals, from diodes 11 and 12 are conducted through respective resistors 28 and 29 and summed at input 30 of a low pass video filter 31 to provide an excitation that is similar to that obtained from a conventional full-wave rectifier. The current wave form at the input 30 of the filter 31 exhibits a Fourier transform similar to that exhibited by the output of a full-wave rectifier driving a constant resistance load. Resistors 28 and 29 which are of equal value were utilized to permit a rate of change of the IF envelope over a 48 dB range in 22 nanoseconds (period of 45 MHz IF) without distortion such as would be caused by diagonal clipping. The video filter 31 which suppresses unwanted frequency components occurring at its input 30, provides a constant group delay to a frequency beyond the 3 dB cutoff.

During operation of the amplitude modulation detector 10, a change in temperature changes the voltage drop across diodes 11 and 12 and 14 and 15. Since diodes 11 and 15 are matched pairs, the voltage drop across 11 and 15 changes equally with temperature; and similarly since diodes 12 and 14 are matched pairs, the voltage drop across 12 and 14 changes equally with temperature. However, the bias current at the cathode junctions of diodes 11 and 12 tends to be lower than the junction current of the referencing diodes 14 and 15. This difference in junction current between the detection diodes 11 and 12, and the referencing diodes 14 and 15 creates a temperature difference between the diodes 11 and 15, and between the diodes 12 and 14. Although this previously proposed network provided adequate temperature compensation for the purposes intended, the inclusion of the resistors 28 and 29, in one sense, appeared to reduce diagonal clipping of the wave form, and in another sense, tended to limit the dynamic range and linearity of the amplitude modulation apparatus.

Thus, it is desirable to provide an envelope detector that provides optimum temperature compensation without limiting the dynamic range and linearity.

SUMMARY OF THE INVENTION

In accordance with the present invention, there is provided a wide dynamic range linear envelope detector that is configured to subject the rectifying and reference diodes to identical operating conditions to provide optimum temperature compensation over a wide temperature range.

More specifically, there is provided a wide dynamic range linear envelope detector that includes a pair of matched diode rectifiers that are commonly connected at their cathode junctions, a first resistor in series with the common connection, is connected to the input of a low pass video filter. A second resistor is connected in parallel with the filter input and a third resistor is connected in parallel with the filter output. The first, second and third resistors are provided to minimize any impedance mismatch with the filter input as a result of the alternate on-off states of the pair of diode rectifiers. The envelope detector is coupled to an amplifying stage through a transformer having a pair of series connected secondary windings, which pair is connected across the anodes of the diode rectifiers. A forward biasing circuit for the diodes applies a d.c. voltage and trickle current between the series connected secondary windings and through the pair of diodes to the output of an operational amplifier to provide a selected voltage at the input of the filter. The operational amplifier acts as a voltage follower and has applied to one of its inputs a selected reference voltage. In parallel with the reference voltage and the input of the operational amplifier and connected at its anode is a reference diode rectifier which is matched with the pair of diode rectifiers. A fourth resistor is connected to its cathode. The fourth resistor is selected to have a value which depends on the values of the first, second and third resistors, thus subjecting all three matched diode rectifiers to the same operating conditions to provide optimum temperature compensation.

In a still more specific aspect, the value of the fourth resistor is selected to equal two times the sum of the first resistor plus the total of the product of the second and third resistors divided by the sum of the second and third resistors to provide the identical operating conditions.

DESCRIPTION OF THE PREFERRED EMBODIMENT

Figure 1:
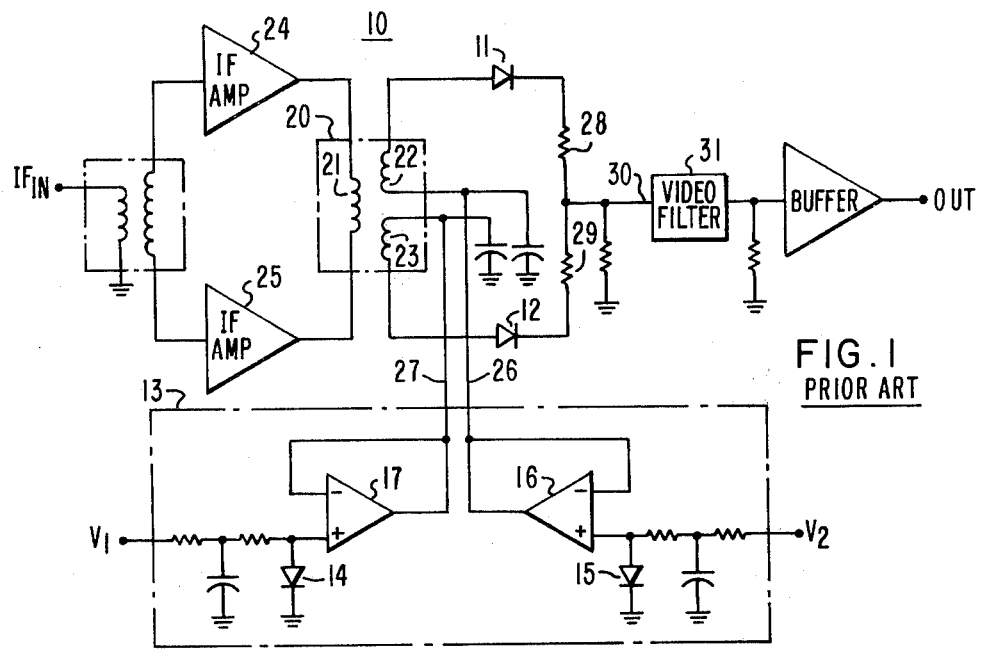
FIG. 1 is a schematic diagram of an envelope detector proposed prior to the present invention.
Figure 2:
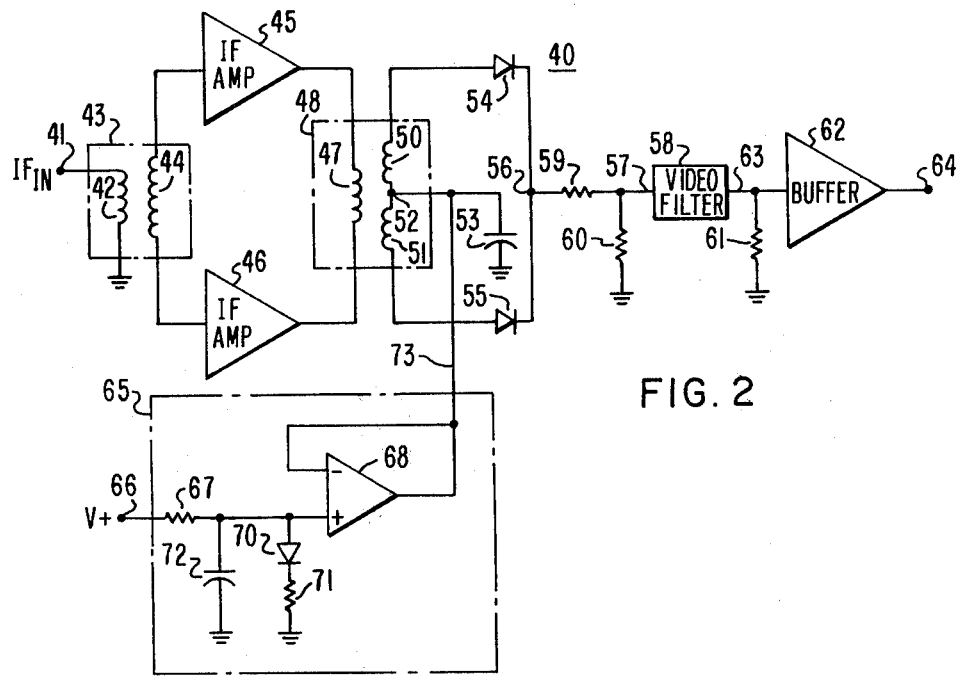
FIG. 2 is a schematic diagram of an envelope detector according to one embodiment of the present invention.

Referring to FIG. 2, the temperature compensated wide dynamic range linear envelope detector in accordance with the present invention is referred to generally as 40. The intermediate frequency (IF) is applied at input 41 to a primary winding 42 of a conventional transformer 43 which has an impedance ratio of one to two; that is, 50 to 100 ohms capable of operating in the neighborhood of an IF bandwidth. A secondary winding 44 of the transformer 43 is connected to the inputs of amplifiers 45 and 46, which are suitable for amplification of an IF signal for example, and may be of the type commonly referred to as T-8 CAN amplifiers. The outputs of the amplifiers 45 and 46 are connected across a primary winding 47 of a transformer 48 which is preferably a high frequency switching transformer that is capable of operating at 20 to 100 megahertz. The transformer 48 has a pair of series-connected secondary windings 50 and 51 having an intermediate tap 52 that is connected to a grounded smoothing capacitor 53. A pair of diode rectifiers 54 and 55 which are preferably matched Schottky barrier diodes, are connected by way of their anodes to opposite ends of the series-connected windings 50 and 51. The cathode terminals of the diodes 54 and 55 are commonly connected, which common connection is represented at node 56. The diodes 54 and 55 conduct on alternate half-cycles of the IF signal input thus providing full-wave rectified wave forms summed at node 56 for application to input 57 of a low-pass video filter 58 through a series-connected resistor 59, which is sometimes referred to herein as the first resistor. A resistor 60 sometimes referred to herein as the second resistor is connected at one side to ground and at its other side to input 57 of the filter 58. A resistor 61, which is sometimes referred to herein as the third resistor is connected at its one side to ground and at its other side to a common connection between the output of the filter 58 and the input to a buffer 62 which connection is referred to at 63. The values of the first, second and third resistors depends upon the impedance at which it is desired to operate the network 40; and of course, the characteristics of the video filter 58. The first resistor 59 compensates for any impedance mismatch that occurs between the input 57 and the node 56 which occurs by virtue of the alternate conducting and non-conducting condition of the diodes 54 and 55. In one application, the first resistor 59 was selected to be 750 ohms, while the second resistor 60 was selected to have a value of 620 ohms, and the third resistor 61 was selected to have a value of 510 ohms. The buffer 62 has a high input impedance and a low output impedance for maintaining the voltage level at output 64 and also to avoid an impedance mismatch to the video filter 58. The resistor 61 is in effect a termination resistor at the output termination of the low-pass filter 58.

A forward biasing circuit to establish the required forward biasing potential to the diodes 54 and 55 such that the potential varies as a function of temperature in such a manner that the trickle current remains essentially independent of temperature is referred to within the dashed lines 65. This circuit 65 comprises a DC source 66 for applying a reference voltage through a resistor 67 to a non-inverting input of an extremely low offset operational amplifier 68, such an operational amplifier has an input offset of $\pm 250$ $\mu V$, for example. The amplifier 68 is used as a voltage follower to derive the necessary biasing potential for the diodes 54 and 55. A reference diode 70, which is preferably identical to the matched pair of diodes 54 and 55, to in effect complete a matched trio therewith, is connected by its anode to the non-inverting input of the operational amplifier 68 and by its cathode-to-ground through a series-connected resistor 71. A conventional smoothing capacitor 72 is connected in parallel with the diode 70 to eliminate any perturbations of the DC voltage. The value of the resistor 67 is selected to provide the proper voltage in combination with the diode 70 and the resistor 71 to the non-inverting input of the operational amplifier 68 to provide the selected biasing voltage and trickle current from output 73 of the operational amplifier 68 to the intermediate node 52 of the secondary winding 50 and 51 of the coupling transformer 48. A stiff biasing voltage, the value of which depends on the characteristics of the specific diode rectifiers utilized, is needed since the current that must flow through the operational amplifier 68 without changing its voltage is preferably in the range from 12 microamperes to 10 milliamperes in producing the 51 dB linear range of operation.

The value of the resistor 67 is selected to provide the appropriate voltage in combination with the diode 70 and the resistor 71 to the non-inverting input of the OP AMP 68 thereby resulting in the proper biasing voltage from output 73 of the OP AMP 68 to the intermediate node 52 of the secondary winding 50 and 51. Such biasing voltage, of course, has a slight voltage drop through diodes 54 and 55, which drop, changes with temperature as is well known. The current is then summed at node 56 for input through resistor 59 to the input 57 of the low-pass video filter 58. The resistor 71 has a value that is selected such that the operating conditions to which all three of the diodes 54, 55, and 70 are subjected is identical. To provide such identical operating conditions, the value of the resistor is determined in accordance with the following formula:

$$R4 = \left[R1 + \left(\frac{R2 \times R3}{R2 + R3}\right)\right] \times 2$$

where R4 is the resistor 71, R1 is the resistor 59, R2 is the resistor 60, and R3 is the resistor 61. Thus, when a temperature change occurs diodes 54, 55 and 70 will experience the same amount of increase or decrease in voltage drop. The voltage source 66 is selected to be much larger than the change in voltage drop across diode 70, such that the current through diode 70 and resistor 71 remains constant through the temperature changes. For example, an increase of voltage drop across diodes 70, 54 and 55 will cause an increase of voltage at the non-inverting terminal of the op amp 68 which, in turn, increases the voltage at the anode of diodes 54 and 55 resulting in having a constant bias current through the diodes 54 and 55 to provide the optimum temperature compensation.

Figure 3:
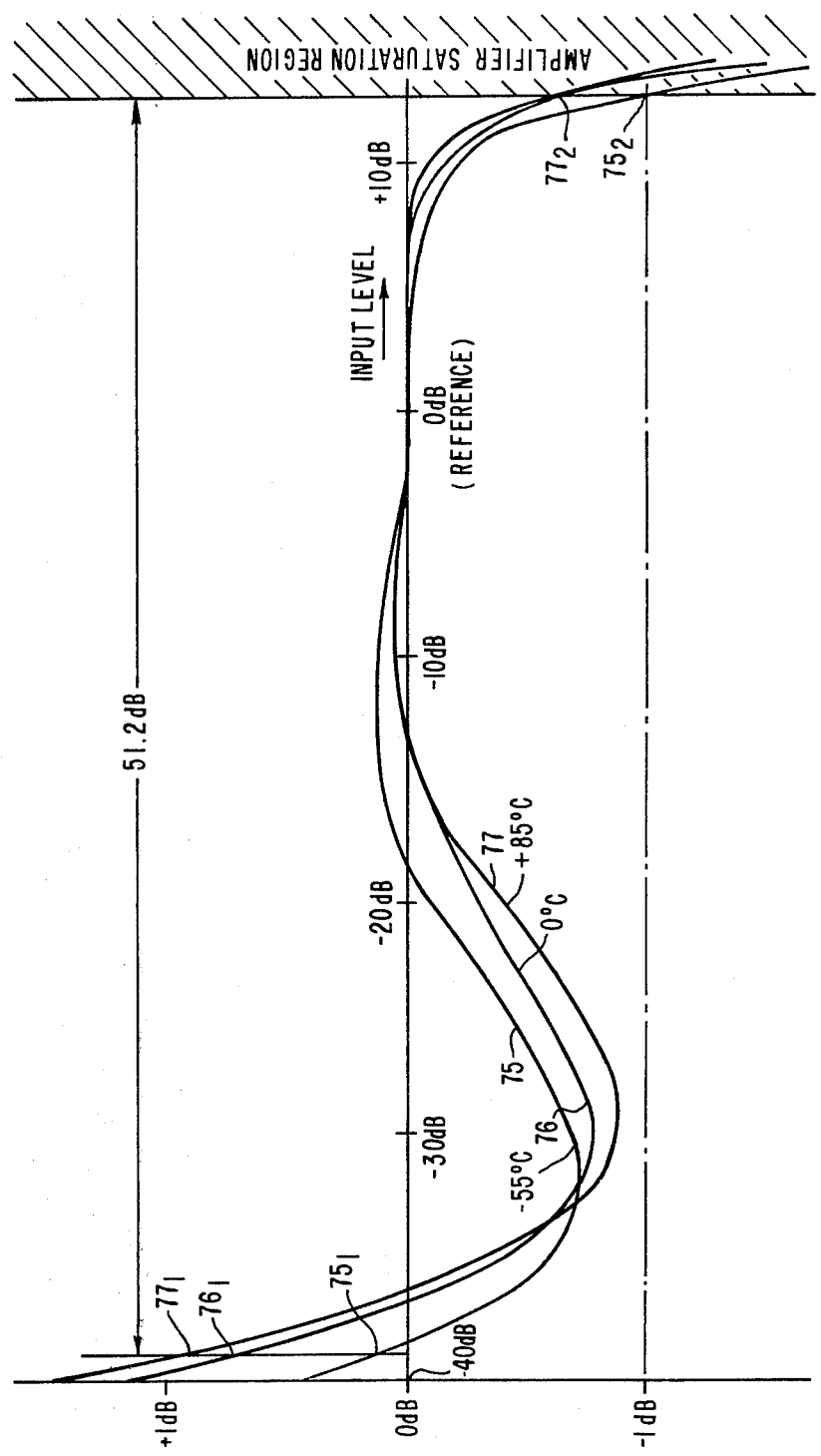
FIG. 3 is a graphical representation of the deviation from linearity at extreme temperatures during operation of the circuit of FIG. 2.

Referring to FIG. 3, an actual circuit constructed in accordance with the present invention was operated in ambient temperatures of −55° C., and then again at 0° C., and then again at 85° C., to produce the results as shown by lines 75, 76, and 77, respectively. The bias current equaled approximately 12.4 microamperes at 0° C.; and such bias current through diodes 54 and 55 increased by 6 microamperes at 85° C. and decreased by 3.9 microamperes at −55° C. The reference voltage at output 64 was approximately equal to 0 dBm of the input level. As shown by FIG. 3, over the temperature ranges indicated the deviation from linearity did not exceed ±1 dB over a dynamic range of 51.2 dB as illustrated by points $77_1$ and $77_2$ at a temperature of 85° C.; and is shown at point $76_1$ and $76_2$ at 0° C.; and is shown at point $75_1$ and $75_2$ for −55° C. The nonlinearity at the high signal level is caused by the limitations of both reverse breakdown voltage of the diodes 54 and 55 and the saturation level of the IF amplifiers 45 and 46.

Thus, I have provided an envelope detection circuit that accomplishes optimum temperature compensation without sacrificing dynamic range and linearity of the envelope detection. More specifically, I have provided a IF amplitude detection circuit that provides a dynamic range of greater than 51 dB over a measured temperature range of from −55° C. to 85° C. with less than 1 dB deviation from linear detection.

What I claim is:

1. An amplitude modulation detection apparatus, comprising:
   first means to receive amplitude modulated carrier frequency signals,
   an envelope detection means including a first and second diode rectifier commonly connected at their cathodes to provide a replica of the amplitude modulation of the carrier frequency signal,
   a transformer coupling the first means to the detection means,
   a low-pass video filter to suppress unwanted frequency components,
   second means connecting the commonly connected cathodes to the video filter at its input including a first resistance means (59, 60, 61) to minimize impedance mismatch between the detection means and the video filter,
   and
   a forward biasing means including a DC voltage source connected to an operational amplifier at its input with its output thereof connected to the coupling transformer to forward bias the pair of diodes,
   said forward biasing means including a third diode rectifier connected at its anode to the operational amplifier input and at its cathode to a second resistance means (71) to vary the voltage input to the operational amplifier as a function of temperature, said second resistance means having a value governed by the value of the first resistance means to subject the first, second, and third diode rectifiers to the same operating conditions.

2. An amplitude modulation detection apparatus according to claim 1 wherein the transformer comprises a pair of series-connected secondary windings connected across the anodes of the first and second diode rectifiers, and wherein the output of the operational amplifier is connected intermediate the series-connected secondary windings.

3. An amplitude modulation detection apparatus according to claim 1 wherein the first, second, and third diode rectifiers are a matched trio.

4. An amplitude modulation detection apparatus according to claim 1 wherein the first resistance means comprises a first resistor (59) connected at one side to the commonly connected cathodes of the first and second diode rectifiers and connected at its other side to the input of the video filter, and second (60) and third (61) resistors connected between ground and the input and output of the video filter, respectively.

5. An amplitude modulation detection apparatus according to claim 1 or 2 or 3 or 4 wherein the second resistance means has a value equal to $$R4 = \left[R1 + \left(\frac{R2 \times R3}{R2 + R3}\right)\right] \times 2 \text{ where}$$

R4 is the second resistance means, and R1, R2, and R3 are the first, second, and third resistors respectively of the first resistance means.

6. An amplitude modulation detection apparatus according to claim 1 or 2 or 3 or 4 wherein the first, second, and third diode rectifiers are Schottky barrier diodes.

* * * * *